(12) United States Patent
Matsumoto et al.

(10) Patent No.: US 7,841,056 B2
(45) Date of Patent: Nov. 30, 2010

(54) METHOD OF MANUFACTURING A PIEZOELECTRIC ELEMENT

(75) Inventors: Akihito Matsumoto, Chino (JP); Takamitsu Higuchi, Nerima (JP); Yasuhiro Ono, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/192,161

(22) Filed: Aug. 15, 2008

(65) Prior Publication Data

US 2009/0058231 A1 Mar. 5, 2009

(30) Foreign Application Priority Data

Aug. 27, 2007 (JP) ............... 2007-219933

(51) Int. Cl.
*H04R 17/00* (2006.01)
*H01L 41/053* (2006.01)

(52) U.S. Cl. ............... 29/25.35; 29/830; 310/321; 310/348

(58) Field of Classification Search ............... 29/25.35, 29/847, 830; 156/230; 310/321, 348, 365
See application file for complete search history.

(56) References Cited

U.S. PATENT DOCUMENTS 6,666,943 B2 * 12/2003 Wada et al. ............... 156/230
6,817,073 B2 * 11/2004 Uchiyama et al. ........... 29/25.35
6,928,731 B2 * 8/2005 Le et al. ..................... 29/890.1

FOREIGN PATENT DOCUMENTS

JP 05335864 A * 12/1993
JP 10-125929 5/1998

* cited by examiner

*Primary Examiner*—A. Dexter Tugbang
(74) *Attorney, Agent, or Firm*—Harness, Dickey & Pierce, P.L.C.

(57) ABSTRACT

A method of manufacturing a piezoelectric element includes: forming a first base substrate having an element to be transferred; forming a second base substrate; and transferring the element to the second base substrate. The forming of the element includes forming a first electrode above a first substrate, forming a piezoelectric layer above the first electrode, forming a second electrode above the piezoelectric layer, crystallizing the piezoelectric layer, forming a dielectric layer above the second electrode, and etching the dielectric layer such that part of the second electrode is exposed and the dielectric layer has a protrusion upwardly protruding relative to the second electrode. Forming the second base substrate includes forming a third electrode above a second substrate. The transferring includes bonding the element and the second base substrate such that the second substrate is in contact with the protrusion and the second electrode is in contact with the third electrode.

6 Claims, 6 Drawing Sheets

METHOD OF MANUFACTURING A PIEZOELECTRIC ELEMENT

The entire disclosure of Japanese Patent Application No. 2007-219933, filed Aug. 27, 2007 is expressly incorporated by reference herein.

BACKGROUND

1. Technical Field

The present invention relates to piezoelectric elements and methods for manufacturing the same, actuators and liquid ejection heads.

2. Related Art

Piezoelectric materials composed of oxides including Pb, Zr and Ti which are generally used for piezoelectric elements, such as, PZT type piezoelectric material require heating at high temperatures over about 700° C. for their crystallization. As a result, substrate materials are restricted to high temperature materials, such as, silicon substrates. When a transparent substrate, such as, for example, a glass substrate, a quartz substrate and the like is used as the substrate material, it is difficult to form devices such as piezoelectric elements directly on the substrate. To address this difficulty, for example, Japanese laid-open patent application JP-A-10-125929 describes a method in which an element to be separated is formed in advance on a substrate with excellent thermal resistance property, a heat treatment is applied to the element to be separated, and the element to be separated is then separated from the substrate and transferred onto another substrate with relatively inferior thermal resistance property.

In order to drive the element that has been transferred onto the other substrate as a piezoelectric element, the element needs to be wired. However, the aforementioned document does not describe a method to wire the element.

SUMMARY

In accordance with an advantage of some aspects of the invention, it is possible to provide piezoelectric elements that can be transferred from a first substrate to a second substrate, and can be wired by a relatively simple wiring method, and a method for manufacturing such piezoelectric elements.

In accordance with another advantage of some aspects of the invention, actuators and liquid ejection heads including the piezoelectric elements can be provided.

In accordance with an embodiment of the invention, a method for manufacturing a piezoelectric element includes the steps of: forming a first base substrate having an element to be transferred; forming a second base substrate; and transferring the element to be transferred from the first base substrate to the second base substrate, wherein the step of forming the element to be transferred includes forming a first electrode above a first substrate, forming a piezoelectric layer above the first electrode, forming a second electrode above the piezoelectric layer, crystallizing the piezoelectric layer, forming a dielectric layer at least above the second electrode, and etching the dielectric layer such that at least a portion of the second electrode is exposed and the dielectric layer has a protrusion upwardly protruding with respect to the second electrode, the step of forming the second base substrate includes forming a third electrode above a second substrate, and the step of transferring includes bonding the element to be transferred and the second base substrate such that the second substrate is in contact with the protrusion and the second electrode is in contact with the third electrode.

According to the method for manufacturing a piezoelectric element in accordance with the embodiment of the invention, it is possible to obtain a piezoelectric element that can be transferred, in particular, from a first base substrate to a second base substrate, and can be wired by a relatively simple wiring method.

In this invention, the term "above" may be used as, for example, in a statement "a specific component (hereinafter called B) is formed above another specific component (hereinafter called A)." In accordance with the invention, the term "above" is used, assuming that such a statement exemplified above includes the case where B is formed directly on A, and the case where B is formed over A through another component provided on A. Similarly, the term "below" is deemed to include the case of forming B directly under A, and the case of forming B under A through another component interposed between them.

The method for manufacturing a piezoelectric element in accordance with an aspect of the invention may further include the steps of forming a fourth electrode above the second base substrate, and electrically connecting the first electrode and the fourth electrode by a wiring layer, wherein the wiring layer may not contact the second electrode and the third electrode through the dielectric layer.

In the method for manufacturing a piezoelectric element in accordance with an aspect of the invention, the wiring layer may be formed by an ink jet.

In the method for manufacturing a piezoelectric element in accordance with an aspect of the invention, the step of forming the piezoelectric layer may be conducted such that the first electrode is located inside the piezoelectric layer as viewed in a plan view, and a portion of the piezoelectric layer that is not interposed between the first electrode and the second electrode may contact the wiring layer.

In the method for manufacturing a piezoelectric element in accordance with an aspect of the invention, the step of etching may be conducted by wet etching.

In the method for manufacturing a piezoelectric element in accordance with an aspect of the invention, the step of forming the first base substrate may further include forming a sacrificial layer between the first substrate and the element to be transferred, and the step of transferring may further include separating the first substrate.

A piezoelectric element in accordance with an embodiment of the invention includes: a substrate; a third electrode formed above the substrate; a second electrode formed above the third electrode and in contact with the third electrode; a dielectric layer formed above the substrate and having a protrusion protruding downwardly with respect to the second electrode, the protrusion being in contact with the substrate; a piezoelectric layer formed above the second electrode; and a first electrode formed above the piezoelectric layer.

In the piezoelectric element in accordance with an aspect of the invention, the first electrode may be electrically connected by a wiring layer to a fourth electrode formed above the substrate, wherein the wiring layer may not contact the second electrode and the third electrode through the dielectric layer.

In the piezoelectric element in accordance with an aspect of the invention, the first electrode may be formed inside the piezoelectric layer as viewed in a plan view, and a portion of the piezoelectric layer that is not interposed between the first electrode and the second electrode may contact the wiring layer.

The piezoelectric element in accordance with an aspect of the invention may further include a cavity section at least between the third electrode and the dielectric layer.

In the piezoelectric element in accordance with an aspect of the invention, the piezoelectric layer may have a tapered shape with a width gradually widening from the second electrode toward the first electrode.

An actuator in accordance with an embodiment of the invention includes the piezoelectric element, wherein the substrate may have a vibration plate.

A liquid jet head in accordance with an embodiment of the invention may include the actuator, a flow path formed in the substrate, and a nozzle plate having a nozzle aperture formed below the substrate and continuous with the flow path.

DESCRIPTION OF EXEMPLARY EMBODIMENTS

Preferred embodiments of the invention are described below with reference to the accompanying drawings.

1. Piezoelectric Element

Figure 1:
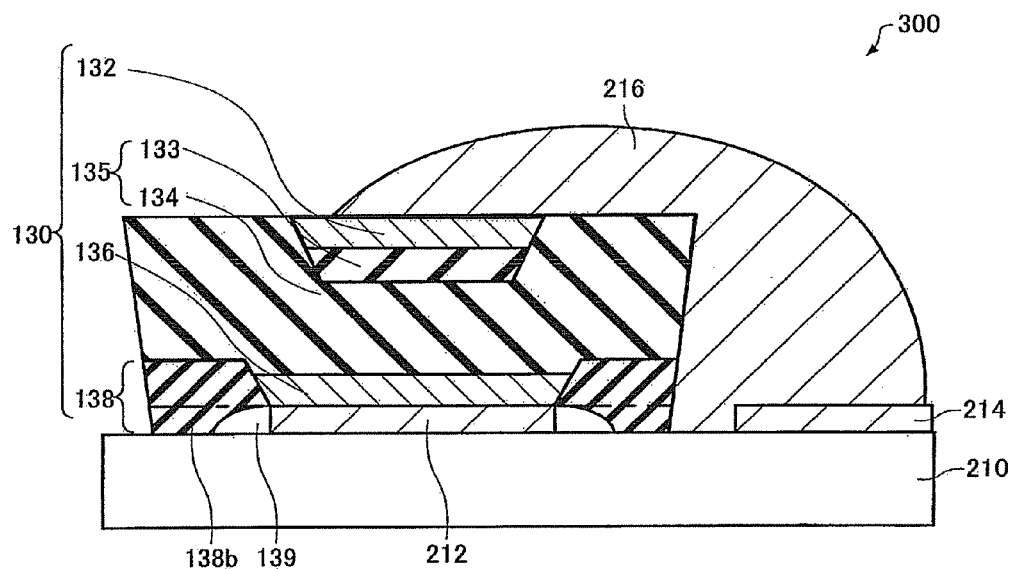
FIG. 1 is a schematic cross-sectional view of a piezoelectric element in accordance with an embodiment of the invention.

FIG. 1 is a schematic cross-sectional view of a piezoelectric element 300 in accordance with an embodiment of the invention.

The piezoelectric element 300 includes, as shown in FIG. 1, a substrate 210, a third electrode 212 formed above the substrate 210, and an element to be transferred 130 formed above the substrate 210 and the third electrode 212. It is noted that, in this embodiment, the element to be transferred 130 includes a second electrode 136 that is in contact with the third electrode 212, a dielectric layer 138 that is formed above the substrate 210, and has a protrusion 138b downwardly protruding with respect to the second electrode 136, wherein the protrusion 138b is in contact with the substrate 210, a piezoelectric layer 135 formed above the second electrode 136 and the dielectric layer 138, and a first electrode 132 formed above the piezoelectric layer 135.

The substrate 210 may have a single layer structure or a multilayer structure. The substrate 210 may be formed with, for example, a vibration plate. As the material for the substrate 210, for example, a semiconductor material or a dielectric material may be used without any particular limitation. More specifically, for example, a glass substrate, a crystal substrate, a quartz substrate or the like may be used as the substrate 210.

The third electrode 212 is formed on the substrate 210. A second electrode 136 of the element to be transferred 130 is formed on the third electrode 212. The third electrode 212 functions as a wiring to be electrically connected to the second electrode 136 of the element to be transferred 130. The third electrode 212 may have a width that is the same as or different from the width of the second electrode 136. The third electrode 212 may have a single layer structure or a multilayer structure. The third electrode 212 may be composed of a metal, a conductive oxide material or the like. As the material for the third electrode 212, for example, gold may be used. The third electrode 212 may be made to a thickness of, for example, about 100 nm, without any particular limitation.

The second electrode 136 is formed on and in contact with the third electrode 212. The second electrode 136 pairs with the first electrode 132, and functions as one of the electrodes that interpose the piezoelectric layer 135. As the material for the second electrode 136, for example, a variety of metals such as nickel, iridium, platinum, titanium and the like, conductive oxides of the aforementioned metals (for example, iridium oxide), strontium ruthenium complex oxide (SrRuO$_3$:SRO), lanthanum nickel complex oxide (LaNiO$_3$:LNO) and the like may be used. Also, the second electrode 136 may be in a single layer of any of the materials, or in a laminate structure of layers of a plurality of the materials exemplified above. The material for a lower surface of the second electrode 136 may be selected depending on the form of bonding with a top surface of the third electrode 212 provided therebelow. For example, when they are bonded by metal thermal bonding, gold may be preferably selected. When they are bonded by surface activation bonding, for example, platinum may be selected. The second electrode 136 may have a thickness of, for example, about 200 nm-800 nm.

The piezoelectric layer 135 is provided on the second electrode 136. The piezoelectric layer 135 may be formed from a material having piezoelectricity. The piezoelectric layer 135 may be formed from perovskite type oxide expressed by, for example, a general formula ABO$_3$. Element A may include lead, and element B may include at least one of zirconium and titanium. For example, element B may further include niobate. More specifically, as the material for the piezoelectric layer 135, lead zirconate titanate (Pb(Zr, Ti)O$_3$:PZT), lead zirconate titanate niobate (Pb(Zr, Ti, Nb)O$_3$:PZTN) may be used. The piezoelectric layer 135 may have a thickness of, for example, 500 nm-3000 nm, depending on the usage of the piezoelectric element 300.

The piezoelectric layer 135 may include, for example, a first piezoelectric layer 133 and a second piezoelectric layer 134. The side surface of the first piezoelectric layer 133 may be formed in a manner to be continuous with the side surface of the first electrode 132. The first piezoelectric layer 133 and the first electrode 132 may be formed inside the second piezoelectric layer 134 as viewed in a plan view. In other words, the piezoelectric layer 135 may have a portion that is interposed between the first electrode 132 and the second electrode 136, and a portion that is not interposed between the first electrode 132 and the second electrode 136. The portion that is not interposed between the first electrode 132 and the second electrode 136 has a function to protect the portion that is interposed between the first electrode 132 and the second electrode 136, which is mainly driven as a piezoelectric body, from external disturbance that may be caused by wirings 216 to be described below. Although not illustrated, the piezoelectric layer 135 may be composed of, for example, a single layer, or a laminate of three or more layers. Also, the piezoelectric layer 135 may have a tapered shape with a width gradually widening from the side of the second electrode 136 toward the first electrode 132.

The first electrode 132 is formed on the first piezoelectric layer 133. The first electrode 132 pairs with the second electrode 136, and functions as one of the electrodes that interpose the piezoelectric layer 135. As the material for the first electrode 132, for example, a variety of metals such as iridium, platinum, titanium and the like, conductive oxides of the aforementioned metals, strontium ruthenium complex oxide ($SrRuO_3$:SRO), lanthanum nickel complex oxide ($LaNiO_3$:LNO) and the like may be used. The first electrode 132 may be in a single layer of any of the materials, or in a laminate structure of layers of a plurality of the materials exemplified above. The first electrode 132 may have a thickness of, for example, about 200 nm-800 nm.

The dielectric layer 138 is formed on the substrate 210. The dielectric layer 138 has a protrusion 138b that downwardly protrudes with respect to the second electrode 136. The protrusion 138b may have, for example, the same thickness as that of the third electrode 212. Also, the protrusion 138b may contact the substrate 210. When the protrusion 138b and the substrate 210 are in contact with each other, for example, the third electrode 212 can be prevented from contacting a wiring 216 to be described below. In other words, the dielectric layer 138 has a function to insulate the wiring 216 from the second electrode 136 and the third electrode 212. The side surface of the dielectric layer 138 may be formed, for example, in a manner to be continuous with the side surface of the piezoelectric layer 135. As the material for the dielectric layer 138, for example, silicon oxide, aluminum oxide or the like may be used.

The dielectric layer 138 may be formed with a cavity section 139 that is provided, for example, between the dielectric layer 138 and the third electrode 212. The cavity section 139 reduces the wiring capacitance of the third electrode 212 and the wiring 216, and has a function to insulate more securely the third electrode 212 from the wiring 216. The cavity section 139 may be formed, for example, between the dielectric layer 138, the second electrode 136 and the third electrode 212.

The piezoelectric element 300 further includes a fourth electrode 214 provided on the substrate 210. The first electrode 132 may be electrically connected to the fourth electrode 214 by the wiring layer 216.

The fourth electrode 214 is electrically connected to the first electrode 132 by the wiring layer 216 in accordance with the present embodiment. The fourth electrode 214 is formed from a metal material, a conductive oxide material or the like. The fourth electrode 214 may have a single layer structure or a multilayer structure. As the material for the fourth electrode 214, for example, gold may be used. The thickness of the fourth electrode 214 may be, for example, about 100 nm without any particular limitation.

The wiring layer 216 is formed in a manner to electrically connect the first electrode 132 with the fourth electrode 214. The wiring layer 216 is formed not to contact the second electrode 136 and the third electrode 212, intervened by the dielectric layer 138. In other words, the wiring layer 216 is insulated from the second electrode 136 and the third electrode 212 by the dielectric layer 138. Therefore, the degree of freedom in selecting the shape of the wiring 216 can be increased. Although not shown, the wiring layer 216 may be formed, for example, in a manner to cover the entirety of the element to be transferred 135. The wiring layer 216 may be, for example, in contact with the piezoelectric layer 135. Also, the wiring layer 216 may be, for example, in contact with the dielectric layer 138. The wiring layer 216 is formed from a metal material, a conductive oxide material or the like. As the material for the wiring layer 216, for example, gold may be used.

The piezoelectric element 300 in accordance with the present embodiment has, for example, the following characteristics.

According to the piezoelectric element 300 in accordance with the present embodiment, the wiring layer 216 does not contact the second electrode 136 and the third electrode 212, intervened by the dielectric layer 138. As a result, the wiring layer 216 can be insulated from the second electrode 136 and the third electrode 212, and the degree of freedom in designing the shape of the wiring layer 216 can be increased.

According to the piezoelectric element 300 in accordance with the present embodiment, the first electrode 132 is formed to be located inside the piezoelectric layer 135 as viewed in a plan view, and a portion of the piezoelectric layer 135 that is not interposed between the first electrode 132 and the second electrode 136 can be formed in a manner to contact the wiring layer 216. As a result, the portion that is not interposed between the first electrode 132 and the second electrode 136 has a function to protect the portion that is interposed between the first electrode 132 and the second electrode 136, which is mainly driven as a piezoelectric body, from external disturbance that may be caused by the wiring 216, and the piezoelectric element 300 can have high reliability.

The piezoelectric element 300 in accordance with the present embodiment can have the cavity section 139 between the third electrode 212 and the dielectric layer 138. As a result, the wiring capacitance of the third electrode 212 and the wiring layer 216 can be reduced, such that the piezoelectric element 300 can have excellent characteristics. Also, the third electrode 212 and the wiring 216 can be more securely insulated from each other.

2. Method for Manufacturing Piezoelectric Element

Next, a method for manufacturing a piezoelectric element 300 in accordance with an embodiment of the invention is described with reference to the accompanying drawings. FIGS. 2-12 are cross-sectional views schematically showing the steps of the method for manufacturing a piezoelectric element in accordance with the present embodiment.

The method for manufacturing a piezoelectric element 300 in accordance with the present embodiment includes the steps of forming a first base substrate 100 having an element to be transferred 130, forming a second base substrate 200, and transferring the element to be transferred 130 from the first base substrate 100 to the second base substrate 200.

(1) First, the step of forming the first base substrate 100 having the element to be transferred 130 is described.

Figure 2:
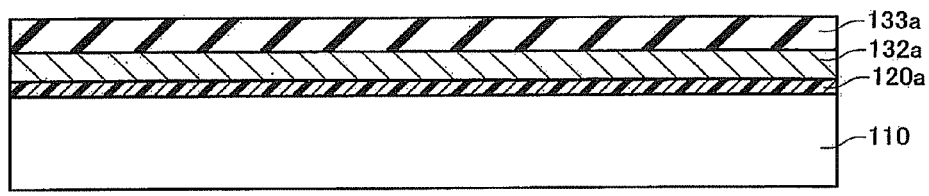
FIG. 2 is a cross-sectional view schematically showing a step of a method for manufacturing a piezoelectric element in accordance with an embodiment of the invention.

As shown in FIG. 2, a first substrate 110 is prepared, and a sacrificial layer 120a, a first electrode layer 132a and a first piezoelectric layer 133a are formed in this order on the first substrate 110.

The first substrate 110 may have a single layer structure or a multilayer structure. As the material for the first substrate 110, for example, a semiconductor material or a dielectric material may be used without any particular limitation. More specifically, for example, a silicon substrate may be used as the first substrate 110.

The material for the sacrificial layer 120a is selected such that its etching rate at the time of dry etching to be described below is greater than the etching rate of the element to be transferred 130 or the first substrate 110. The sacrificial layer 120a may have a single layer structure or a multilayer structure. As the material for the sacrificial layer 120a, for example, allotropes of silicon, more specifically, amorphous silicon, polycrystal silicon and single crystal silicon may be used. The sacrificial layer 120a may have a thickness of, for example, about 100 nm-20 µm. The sacrificial layer 120a is formed by, for example, a vapor deposition method, a sputter method, a chemical vapor deposition (CVD) method, or the like.

The first electrode layer 132a is formed by, for example, a sputter method, a plating method, a vacuum deposition method, or the like.

The first piezoelectric layer 133a may be formed by, for example, a sol-gel method, a CVD method, a metal organic deposition (MOD) method, a sputter method, a laser ablation method or the like.

Figure 3:
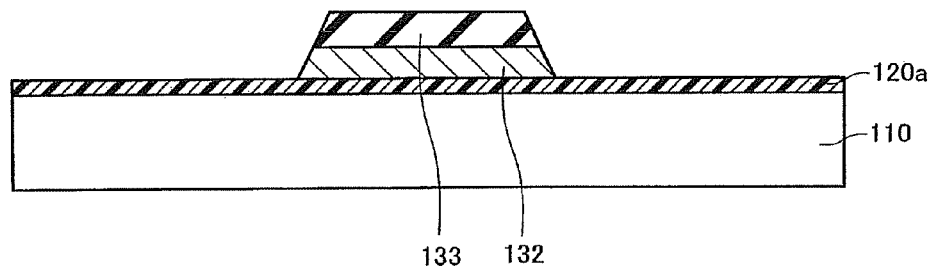
FIG. 3 is a cross-sectional view schematically showing a step of the method for manufacturing a piezoelectric element in accordance with the embodiment.

As shown in FIG. 3, the first piezoelectric layer 133a and the first electrode layer 132a are patterned, thereby forming a first piezoelectric layer 133 and a first electrode 132. The patterning may be conducted by using, for example, known photolithography technique and etching technique. Each of the layers may be individually patterned, or all of the layers may be patterned in a batch.

Figure 4:
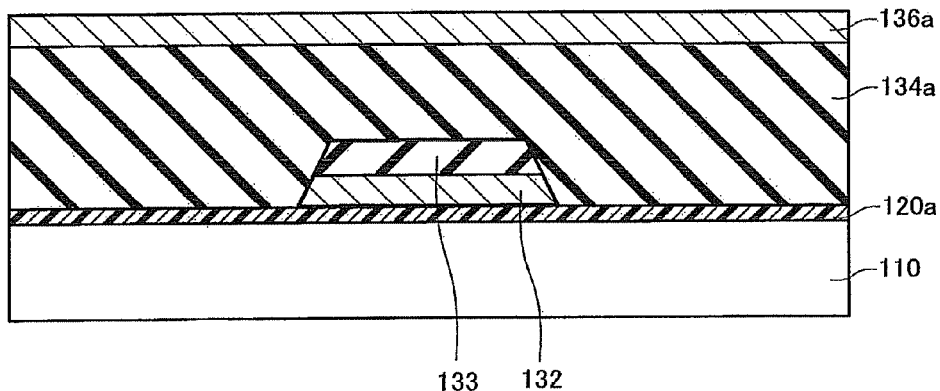
FIG. 4 is a cross-sectional view schematically showing a step of the method for manufacturing a piezoelectric element in accordance with the embodiment.

As shown in FIG. 4, a second piezoelectric layer 134a is formed on the sacrificial layer 120a and the first piezoelectric layer 133, and a second electrode layer 136a is formed on the second piezoelectric layer 134a.

The second piezoelectric layer 134a may be formed by, for example, a sol-gel method, a CVD method, a MOD method, a sputter method, a laser ablation method or the like.

The second electrode layer 136a is formed by, for example, a sputter method, a plating method, a vacuum deposition method or the like.

Figure 5:
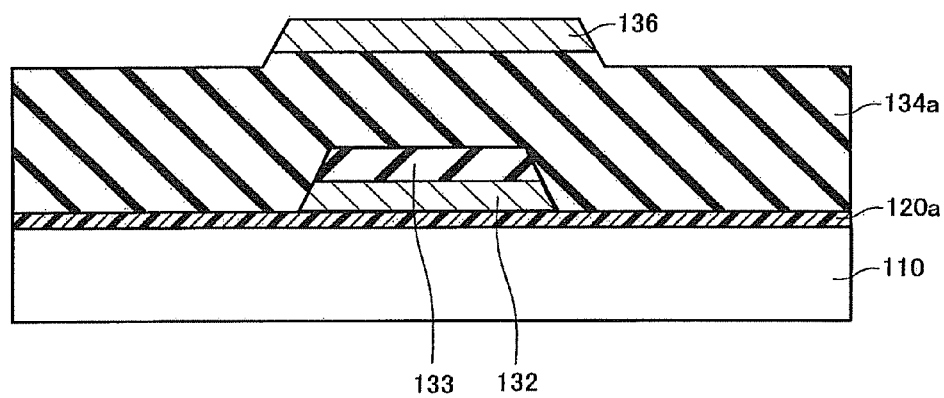
FIG. 5 is a cross-sectional view schematically showing a step of the method for manufacturing a piezoelectric element in accordance with the embodiment.

As shown in FIG. 5, the second electrode layer 136a is patterned to form a second electrode 136. The patterning may be conducted by, for example, known photolithography technique and etching technique. The second piezoelectric layer 134a may be, for example, over-etched at the time of patterning such that its top surface is etched.

After the second electrode 136 has been formed, sintering may be conducted to crystallize the first piezoelectric layer 133 and the second piezoelectric layer 134a. By this sintering, the piezoelectric layers in amorphous state or insufficient crystalline state can be sufficiently crystallized. The sintering may be conducted at temperatures, for example, between 500° C. and 1100° C. It is noted that the sintering for crystallization may be conducted before the element to be transferred 130 is transferred from the first base substrate 100 to the second base substrate 200. For example, the sintering may be conducted after the second electrode layer 136a shown in FIG. 4 has been formed. Alternatively, the sintering may be conducted after formation of the first piezoelectric layer 133a shown in FIG. 2 and after forming of the second piezoelectric layer 134a shown in FIG. 4, respectively.

Figure 6:
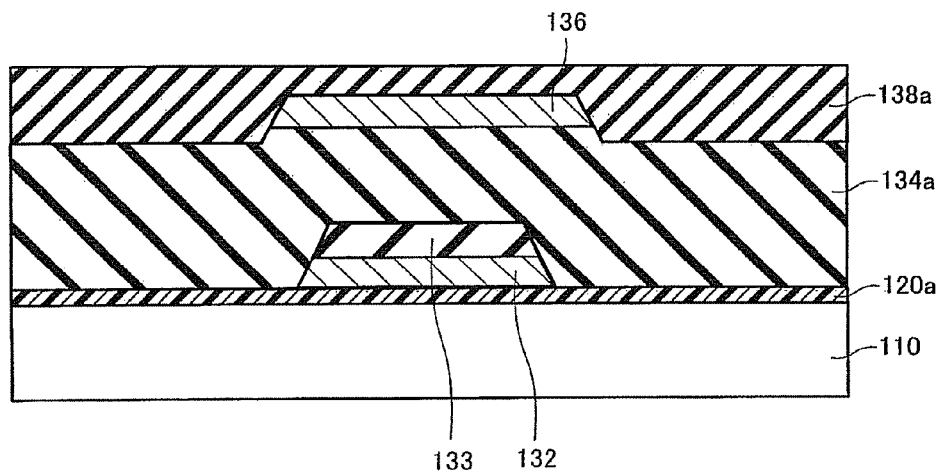
FIG. 6 is a cross-sectional view schematically showing a step of the method for manufacturing a piezoelectric element in accordance with the embodiment.

As shown in FIG. 6, a dielectric layer 138a is formed on the second electrode 136 and the second piezoelectric layer 134a. The dielectric layer 138a may be formed by, for example, a CVD method or the like.

Figure 7:
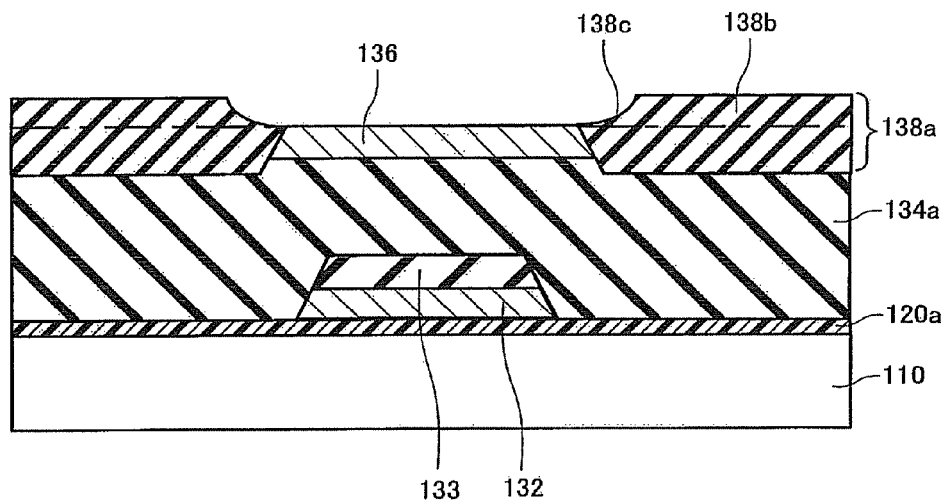
FIG. 7 is a cross-sectional view schematically showing a step of the method for manufacturing a piezoelectric element in accordance with the embodiment.
Figure 11:
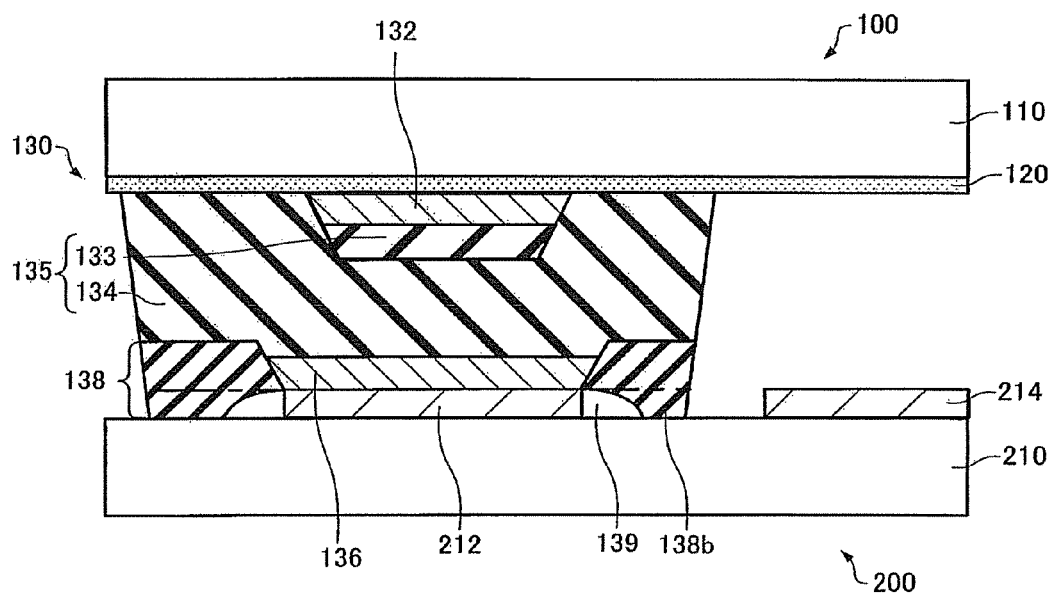
FIG. 11 is a cross-sectional view schematically showing a step of the method for manufacturing a piezoelectric element in accordance with the embodiment.

As shown in FIG. 7, the second electrode 136 is exposed by etching. The entire top surface of the second electrode 136 may be exposed, or a portion of the top surface may be exposed. Also, the side surface of the second electrode 136 may be exposed. The etching may be conducted such that the dielectric layer 138a has a protrusion 138b upwardly protruding with respect to the second electrode 136. The etching may be conducted by, for example, isotropic etching such as wet etching, or anisotropic etching such as dry etching. However, in consideration of the cost and easiness of the process, the etching may preferably be conducted by wet etching. By isotropic etching such as wet etching, the dielectric layer 138a can have a curved section 138c. The curved section 138c can form one surface of a cavity section 139 when the element to be transferred 130 is bonded to a second base substrate 200, as shown in FIG. 11.

Figure 8:
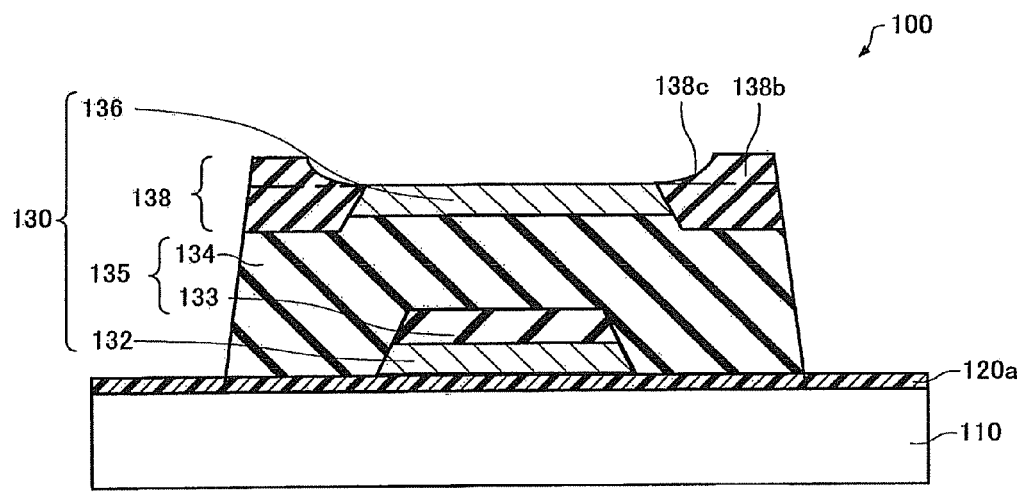
FIG. 8 is a cross-sectional view schematically showing a step of the method for manufacturing a piezoelectric element in accordance with the embodiment.

As shown in FIG. 8, the dielectric layer 138a and the second piezoelectric layer 134a are patterned, thereby forming a dielectric layer 138 and a second piezoelectric layer 134. The first piezoelectric layer 133 and the second piezoelectric layer 134 form a piezoelectric layer 135. The patterning is conducted such that the first electrode 133 is located inside the second piezoelectric layer 134, as viewed in a plan view. The dielectric layer 120a may not be patterned, as shown in the figure, or may be patterned. The patterning may be conducted such that, for example, the second piezoelectric layer 134 has a tapered shape whose width gradually widens from the side of the second electrode 136 toward the first electrode 132. The patterning may be conducted by using, for example, known dicing technique, photolithography technique and etching technique or the like. Each of the layers may be patterned individually, or all of the layers may be patterned in a batch. It is noted that, although not shown, the piezoelectric layer 135 may be composed of, for example, a single layer or a laminated layer including three or more layers.

By the steps described above, the first base substrate 100 having the element to be transferred 130 is formed.

(2) Next, a process of forming a second base substrate is described.

Figure 9:
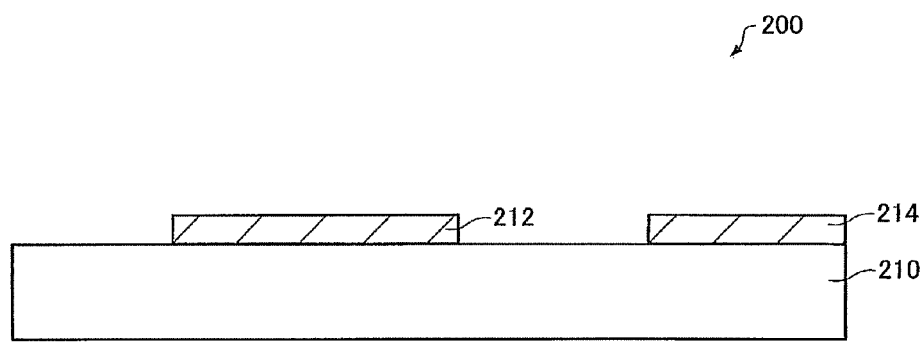
FIG. 9 is a cross-sectional view schematically showing a step of the method for manufacturing a piezoelectric element in accordance with the embodiment.

As shown in FIG. 9, a second substrate 210 is prepared, and a third electrode 212 and a fourth electrode 214 are formed on the second substrate 210. The second substrate 210 corresponds to the substrate 210 shown in FIG. 1. The third electrode 212 and the fourth electrode 214 may be formed by, for example, a vapor deposition method, a sputter method, a CVD method, a plating method or the like. It is noted that the third electrode 212 and the fourth electrode 214 may be formed concurrently or individually.

By the steps described above, the second base substrate 200 is formed.

(3) Next, a process of transferring the element to be transferred 130 from the first base substrate 100 to the second base substrate 200 is described.

Figure 10:
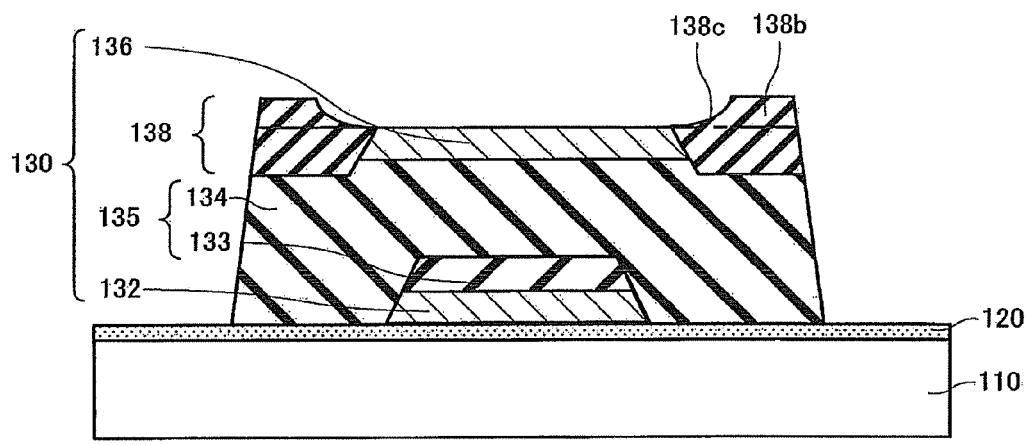
FIG. 10 is a cross-sectional view schematically showing a step of the method for manufacturing a piezoelectric element in accordance with the embodiment.

As shown in FIG. 10, a sacrificial layer 120 whose adhesion is smaller than that of the sacrificial layer 120a described above is formed on the first base substrate 100. By forming the sacrificial layer 120, for example, the element to be transferred 130 can be readily separated from the first substrate 110 by, for example, an external force, a laser beam or the like. The sacrificial layer 120 may be formed, for example, through reacting the sacrificial layer 120a to dry chemical etching that uses xenon fluoride as an etchant.

As shown in FIG. 11, the element to be transferred 130 and the second base substrate 200 are joined to each other in a manner that the second substrate 210 contacts the protrusion 138b of the dielectric layer 138, and the second electrode 136 contacts the third electrode 212. FIG. 11 is a cross-sectional view showing that the first base substrate 100 shown in FIG. 100 that is turned up-side down is superposed on the second base substrate 200. The protrusion 138b and the second substrate 210 are in contact with each other such that, for example, the third electrode 212 can be prevented from contacting a wiring 216 to be described below. Also, the second electrode 136 and the third electrode 212 are bonded by, for example, a thermal fusion method or a surface-activation bonding method, and therefore are mechanically and electrically connected to each other. It is noted that the step of forming the sacrificial layer 120 by reducing the adhesion of the sacrificial layer 120a shown in FIG. 10 may be conducted after the element to be transferred 130 and the second base substrate 200 are bonded together.

Figure 12:
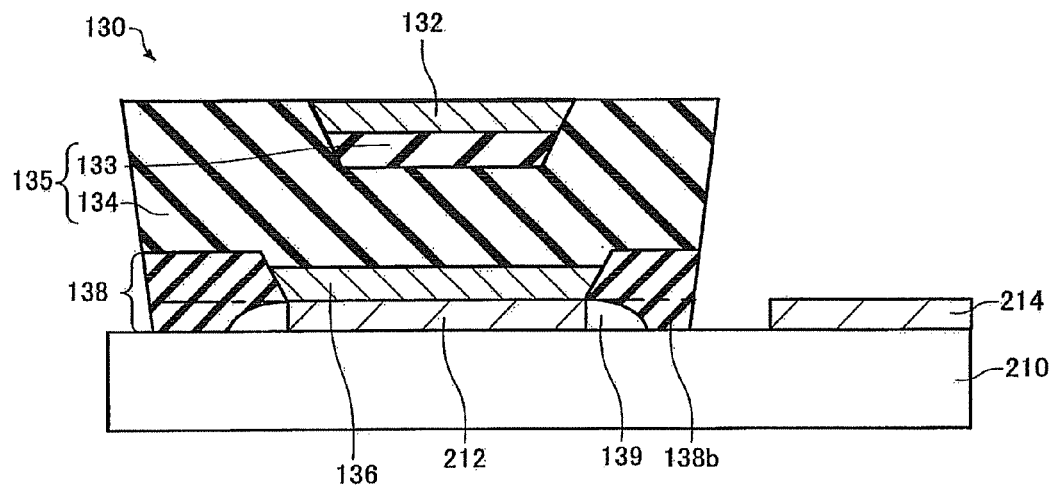
FIG. 12 is a cross-sectional view schematically showing a step of the method for manufacturing a piezoelectric element in accordance with the embodiment.

As shown in FIG. 12, the first substrate 110 is separated from the element to be transferred 130. As described above, the sacrificial layer 120 has lower adhesion, such that the element to be transferred 130 can be readily removed from the first substrate 100 by, for example, an external force, a laser beam or the like.

By the steps described above, the element to be transferred 130 can be transferred from the first base substrate 100 to the second base substrate 200.

(4) As shown in FIG. 1, the method for manufacturing the piezoelectric element 300 in accordance with the present embodiment may further include the step of electrically connecting the first electrode 132 and the fourth electrode 214 by a wiring layer 216.

The wiring 216 is formed in a manner not to contact the second electrode 136 and the third electrode 212, intervened by the dielectric layer 138. In other words, the wiring 216 is insulated by the dielectric layer 138 from the second electrode 136 and the third electrode 212. Therefore, the degree of freedom in fabricating the wiring layer 216 can be increased. The wiring layer 216 may be formed by, for example, a relatively simple method, such as, an ink jet method.

By the steps described above, the piezoelectric element 300 in accordance with the present embodiment shown in FIG. 1 can be manufactured.

The method for manufacturing the piezoelectric element 300 in accordance with the present embodiment has, for example, the following characteristics.

According to the method for manufacturing the piezoelectric element 300 in accordance with the present embodiment, the wiring 216 is formed in a manner not to contact the second electrode 136 and the third electrode 212, intervened by the dielectric layer 138. Therefore, the degree of freedom in fabricating the wiring layer 216 can be increased. For example, the wiring layer 216 can be formed by an ink jet that is characterized by fewer mechanical impacts and higher placement accuracy, compared to a bonding method, and therefore the piezoelectric element 300 can be manufactured by a relatively simple process.

According to the method for manufacturing the piezoelectric element 300 in accordance with the present embodiment, a part of the second electrode 136 can be exposed by etching the dielectric layer 138, using a wet etching method. As a result, the piezoelectric element 300 can be manufactured by a relatively simple process.

According to the method for manufacturing the piezoelectric element 300 in accordance with the present embodiment, sintering for crystallizing the piezoelectric layer 135 can be conducted before it is transferred. Therefore, the piezoelectric element 300 can be formed, for example, on a substrate that is relatively inferior in thermal resistance.

3. Liquid Jet Head

Next, a liquid jet head in which piezoelectric elements in accordance with the invention function as actuators is described.

Figure 13:
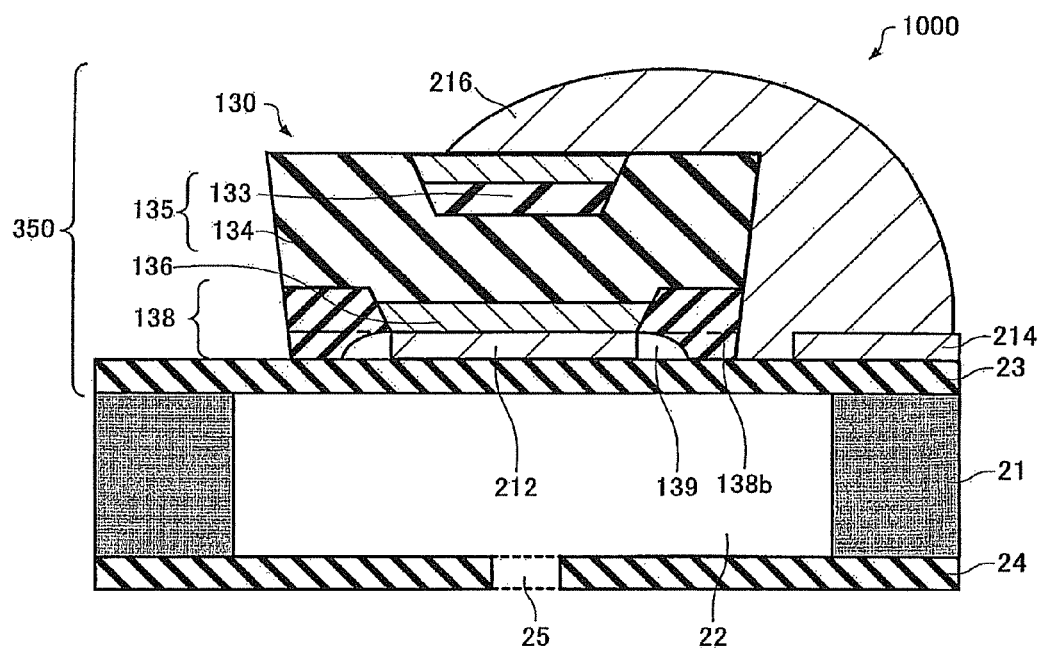
FIG. 13 is a schematic cross-sectional view of a liquid jet head in accordance with an embodiment of the invention.
Figure 14:
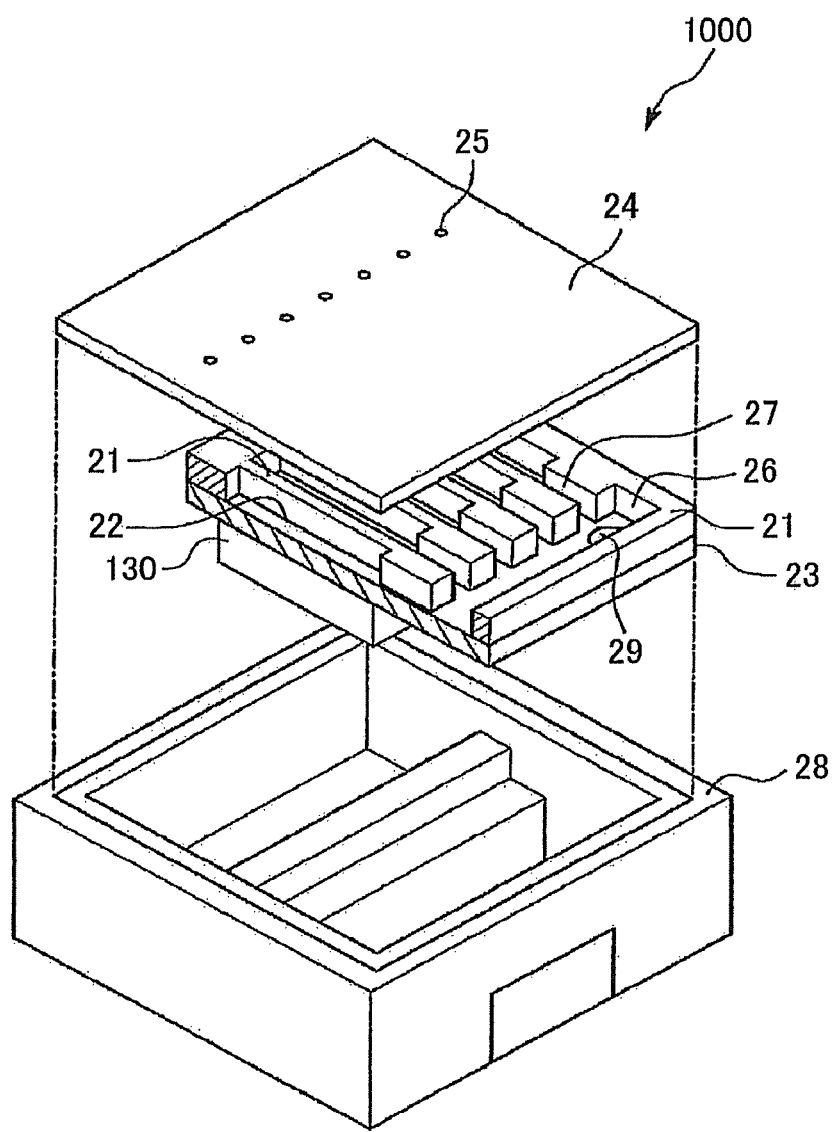
FIG. 14 is a schematic exploded perspective view of the liquid jet head in accordance with the present embodiment.

FIG. 13 is a schematic cross-sectional view of a main portion of a liquid jet head 1000 in accordance with an embodiment of the invention. FIG. 14 is a schematic exploded perspective view of the liquid jet head 1000 in accordance with the present embodiment. It is noted that FIG. 14 shows the head upside down with respect to a state in which it is normally used.

The liquid jet head 1000 includes, as shown in FIG. 13, a nozzle plate 24, a substrate 21 and an actuator 350. The actuator 350 has a vibration plate 23 formed on the substrate 21, a third electrode 212 formed on the vibration plate 23, an element to be transferred 130 formed on the vibration plate 23 and the third electrode 212, a fourth electrode 214 formed on the vibration plate 23, and a wiring layer 216 that connects the element to be transferred 130 with the fourth electrode 214. The element to be transferred 130 includes a first electrode 132, a piezoelectric layer 135, a second electrode 136, and a dielectric layer 138. It is noted that, in FIG. 14, illustration of the layers of the element to be transferred 130, the third electrode 212, the fourth electrode 214 and the wiring layer 216 is omitted.

The liquid jet head 1000 further includes a housing 28, as shown in FIG. 14. The housing 28 stores the nozzle plate 24, the substrate 21, the vibration plate 23, the third electrode 212 and the element to be transferred 130. The housing 28 is formed with, for example, any one of various resin materials or various metal materials.

The nozzle plate 24 is formed from, for example, a rolled plate of stainless steel or the like. The nozzle plate 24 includes multiple nozzle holes 25 formed in a row for jetting liquid droplets. A substrate 21 is affixed to the nozzle plate 24. The substrate 21 divides the space between the nozzle plate 24 and a vibration plate 23, thereby forming a reservoir 26, supply ports 27 and a plurality of flow paths 22. The reservoir 26 temporarily reserves liquid that is supplied from a liquid cartridge (not shown). The liquid is supplied from the reservoir 26 to the respective flow paths 22 through the supply ports 27.

The flow path 22 is disposed for each of the corresponding nozzle holes 25, as shown in FIG. 13 and FIG. 14. The nozzle holes 25 are continuous with the flow paths 22. Each of the flow paths 22 has a volume that is variable by vibrations of the vibration plate 23. The volume change causes the liquid to be ejected from the flow path 22.

A through hole 29 that penetrates the vibration plate 23 in its thickness direction is formed in the vibration plate 23 at a predetermined position, as shown in FIG. 14. Liquid is supplied from an ink cartridge to the reservoir 26 through the through hole 29.

An element to be transferred 130 is electrically connected to a piezoelectric element driving circuit (not shown), and is capable of operating (vibrating, deforming) based on signals of the piezoelectric element driving circuit. The vibration plate 23 is vibrated by vibration (warping) of the element to be transferred 130, whereby the inner pressure of the flow path 22 can be instantaneously increased.

In the method for manufacturing the actuator 350 and the method for manufacturing the liquid jet head 1000, the element to be transferred 130, a third electrode 212, a fourth electrode 214 and a wiring layer 216 are formed, using the methods for manufacturing the element to be transferred 130, the third electrode 212, the fourth electrode 214 and the wiring layer 216 in accordance with the embodiment described above, respectively. Also, the method for manufacturing the liquid jet head 1000 includes the steps of forming the vibration plate 23 on the substrate 21, forming the flow paths 22 in the substrate 21, and forming the nozzle plate 24 below the substrate 21. The vibration plate 23, the flow paths 22 and the nozzle plate 24 may be formed by a known method.

The piezoelectric element 300 in accordance with the present embodiment can be manufactured by a relatively simple process, as described above. Accordingly, the actuator 350 and the liquid jet head 1000 which are manufactured by a relatively simple process can be provided.

The embodiments of the invention are described above in detail. However, those skilled in the art should readily understand that many modifications can be made without departing in substance from the novel matter and effects of the invention. Accordingly, all of such modified examples are deemed included in the scope of the invention.

What is claimed is:

1. A method of manufacturing a piezoelectric element, the method comprising:
   forming a first base substrate having an element to be transferred;
   forming a second base substrate; and
   transferring the element to be transferred from the first base substrate to the second base substrate,
   wherein the forming of the first base substrate having the element to be transferred includes:
      forming a first electrode above a first substrate,
      forming a piezoelectric layer above the first electrode,
      forming a second electrode above the piezoelectric layer,
      crystallizing the piezoelectric layer,
      forming a dielectric layer at least above the second electrode, and
      etching the dielectric layer such that at least a portion of the second electrode is exposed and the dielectric layer has a protrusion upwardly protruding with respect to the second electrode,
   wherein the forming of the second base substrate includes forming a third electrode above a second substrate, and
   wherein the transferring of the element to be transferred from the first base substrate to the second base substrate includes bonding the element and the second base substrate such that the second base substrate is in contact with the protrusion and the portion of the second electrode that is exposed is in contact with the third electrode.

2. A method of manufacturing a piezoelectric element according to claim 1, further comprising:
   forming a fourth electrode above the second substrate, and
   electrically connecting the first electrode and the fourth electrode by a wiring layer,
   wherein the wiring layer does not contact the second electrode and the third electrode through the dielectric layer.

3. A method of manufacturing a piezoelectric element according to claim 2, wherein the wiring layer is formed by an ink jet method.

4. A method of manufacturing a piezoelectric element according to claim 2, wherein the forming of the piezoelectric layer is conducted such that the first electrode is located inside the piezoelectric layer as viewed in a plan view, and a portion of the piezoelectric layer that is not interposed between the first electrode and the second electrode contacts the wiring layer.

5. A method of manufacturing a piezoelectric element according to claim 1, wherein the etching is conducted by wet etching.

6. A method of manufacturing a piezoelectric element according to claim 1, wherein the forming of the first base substrate further includes forming a sacrificial layer between the first substrate and the element, and the transferring of the element to be transferred from the first base substrate to the second base substrate further includes separating the first substrate.

* * * * *